(12) United States Patent  
Mouli

(10) Patent No.: US 8,878,191 B2  
(45) Date of Patent: Nov. 4, 2014

(54) FIN FIELD EFFECT TRANSISTORS INCLUDING ENERGY BARRIERS

(75) Inventor: Chandra V. Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/612,376

(22) Filed: Sep. 12, 2012

(65) Prior Publication Data

US 2013/0001593 A1 Jan. 3, 2013

Related U.S. Application Data

(62) Division of application No. 12/329,185, filed on Dec. 5, 2008, now Pat. No. 8,330,170.

(51) Int. Cl.
*H01L 29/15* (2006.01)

(52) U.S. Cl.
USPC ............... 257/77; 257/288; 257/349

(58) Field of Classification Search
CPC ........ H01L 29/7831; H01L 29/66795; H01L 29/41791; H01L 29/1608; H01L 21/3147; H01L 21/3148; H01L 21/02378; H01L 21/02376; H01L 21/02167; H01L 21/02444; H01L 21/02447
USPC ............... 257/77, 288, 349, E21.411
See application file for complete search history.

(56) References Cited

U.S. PATENT DOCUMENTS

| 5,115,289 | A | 5/1992 | Hisamoto et al. |
|---|---|---|---|
| 5,346,834 | A | 9/1994 | Hisamoto et al. |
| 5,466,621 | A | 11/1995 | Hisamoto et al. |
| 5,543,637 | A | 8/1996 | Baliga et al. |
| 7,132,751 | B2 | 11/2006 | Chang |
| 7,238,555 | B2 | 7/2007 | Orlowski et al. |
| 7,338,862 | B2 | 3/2008 | Huo et al. |
| 7,436,004 | B2 | 10/2008 | Shimoida et al. |
| 2004/0048424 | A1* | 3/2004 | Wu et al. ............... 438/154 |
| 2004/0079989 | A1 | 4/2004 | Kaneko et al. |
| 2004/0108523 | A1 | 6/2004 | Chen et al. |
| 2004/0155317 | A1 | 8/2004 | Bhattacharyya |
| 2005/0224786 | A1 | 10/2005 | Lin et al. |
| 2005/0227424 | A1 | 10/2005 | Oh et al. |
| 2005/0285212 | A1 | 12/2005 | Tolchinsky et al. |
| 2006/0060909 | A1 | 3/2006 | Chi et al. |
| 2006/0086990 | A1 | 4/2006 | Misaki et al. |
| 2006/0255364 | A1 | 11/2006 | Saxler et al. |

(Continued)

FOREIGN PATENT DOCUMENTS

| JP | 02-263473 A | 10/1990 |
|---|---|---|
| JP | 11177082 A | 7/1999 |

(Continued)

OTHER PUBLICATIONS

International Preliminary Report on Patentability for International Application No. PCT/US2009/065219 dated Jun. 7, 2011, 4 pages.

(Continued)

*Primary Examiner* — Tan N Tran  
(74) *Attorney, Agent, or Firm* — TraskBritt

(57) ABSTRACT

A semiconductor device structure includes a transistor with an energy barrier beneath its transistor channel. The energy barrier prevents leakage of stored charge from the transistor channel into a bulk substrate. Methods for fabricating semiconductor devices that include energy barriers are also disclosed.

18 Claims, 2 Drawing Sheets

(56) References Cited

U.S. PATENT DOCUMENTS

| | | | |
|---|---|---|---|
| 2006/0284236 A1 | 12/2006 | Bhattacharyya | |
| 2007/0001222 A1 | 1/2007 | Orlowski et al. | |
| 2007/0075351 A1* | 4/2007 | Schulz et al. | 257/314 |
| 2007/0090458 A1* | 4/2007 | Muramoto et al. | 257/347 |
| 2007/0111435 A1* | 5/2007 | Kim et al. | 438/253 |
| 2007/0200142 A1 | 8/2007 | Lee et al. | |
| 2007/0290212 A1* | 12/2007 | Mazzola | 257/77 |
| 2008/0079060 A1* | 4/2008 | Zhu | 257/321 |
| 2008/0173896 A1 | 7/2008 | Lin et al. | |
| 2008/0237606 A1 | 10/2008 | Kikkawa et al. | |
| 2010/0140709 A1 | 6/2010 | Mouli | |

FOREIGN PATENT DOCUMENTS

| | | |
|---|---|---|
| JP | 2004273551 A | 9/2004 |
| JP | 2005203798 A | 7/2005 |
| KR | 10-2005-0099328 | 10/2005 |
| WO | 2008070272 A1 | 6/2008 |
| WO | 2009134089 A2 | 11/2009 |

OTHER PUBLICATIONS

Eickhoff, M., "Selective growth of high quality 3C-SiC using SiO2 sacrificial layer technique," Thin Solid Films 345 (2): 197-99 (1999).

Ernst T., et al., "A new Si:C epitaxial channel nMOSFET architecture with improved drivability and short channel characteristics," VLSI Symp. 2003:51 52 (2003).

Ernst T., et al., "Fabrication of a Novel strained SiGe:C channel planar 55nm nMOSFET for High Performance CMOS," VLSI Symp. 2002:92 93 (2002).

International Search Report, International Application No. PCT/US2009/065219, mailed Jun. 29, 2010, 3 pages.

Miura, H., et al., "Epitaxial Growth of SiC on Silicon on Insulator Substrates with Ultrathin Top Si Layer by Hot Mesh Chemical Vapor Deposition," Japan J. Appl. Phys 47(1): 569 (2008).

Stęszewski, J., et al., "Comparison of 4H SiC and 6H SiC MOSFET IV characteristics simulated with Silvaco Atlas and Crosslight Apsys," J. Telecomm. & I.T., Mar. 2007, p. 93.

Written Opinion of the International Searching Authority, International Application No. PCT/US2009/065219, mailed Jun. 29, 2010, three (3) pages.

J.W. Han et al., "Band Offset FinFET-Based URAM (Unified-RAM) Built on SiC for Multi-Functioning NVM and Capacitorless 1T-DRAM," 2008 Symposium on VLSI Technology Digest of Technical Papers, Jun. 2008, pp. 200-201.

* cited by examiner

"0" CONDITION

"1" CONDITION

FIN FIELD EFFECT TRANSISTORS INCLUDING ENERGY BARRIERS

CROSS-REFERENCE TO RELATED APPLICATION

This application is a divisional of U.S. patent application Ser. No. 12/329,185, filed Dec. 5, 2008, now U.S. Pat. No. 8,330,170, issued Dec. 11, 2012, the disclosure of which is hereby incorporated herein in its entirety by this reference.

TECHNICAL FIELD

Embodiments of the present invention relate generally to semiconductor device structures that are configured to reduce or eliminate the leakage of stored charge, or "junction leakage," from transistor channels. More specifically, embodiments of the present invention relate to semiconductor devices in which energy barriers are disposed adjacent to transistor channels and, even more specifically, to semiconductor devices with energy barriers that comprise silicon carbide.

BACKGROUND

In nMOS (n-type metal-oxide-semiconductor) transistors, the transistor channels comprise n-type semiconductor material, in which electrons comprise the majority of charge carriers, and holes are the carriers that store charge. The n-type channels of such devices are sometimes formed in a bulk substrate that comprises a p-type semiconductor material, in which the majority of charge carriers comprise holes. The memory data retention times of some nMOS transistors (e.g., floating body effect- (FBE-) based 1TOC DRAM cells) depend at least partially upon the length of time that the holes, which have a tendency to "travel" into the p-type semiconductor material of the bulk substrate, may be retained within the n-type channels.

DETAILED DESCRIPTION

The present invention, in various embodiments, includes semiconductor device structures with transistors that include channels that are configured for minimal junction leakage. An energy barrier with physical properties (e.g., a band gap, a low intrinsic concentration of charge carriers, etc.) is located against a transistor channel to prevent leakage of storage charge carriers from the transistor channel into the bulk substrate upon which the semiconductor device has been fabricated.

Figure 1:
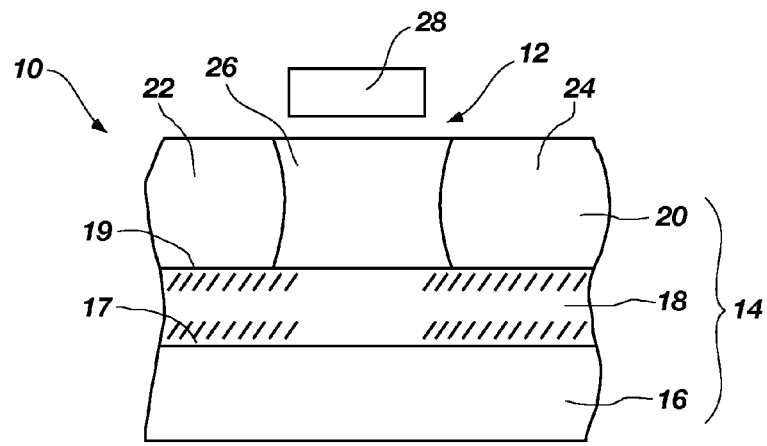
FIG. 1 is a schematic representation of an embodiment of a semiconductor device structure that includes an energy barrier beneath at least one transistor.

An embodiment of a semiconductor device structure 10 of the present invention is depicted by FIG. 1. Semiconductor device structure 10 includes one or more transistors 12 fabricated upon and/or carried by a fabrication substrate 14. Fabrication substrate 14 includes a base substrate 16, an energy barrier 18 on at least some portions of a carrier surface 17 of base substrate 16, and a semiconductor film 20 on at least portions of energy barrier 18. Elements of a transistor 12, including source and drain regions 22, 24 and a channel 26 between source and drain regions 22, 24, are formed from semiconductor film 20, with a gate 28 of transistor 12 being formed on an opposite side of semiconductor film 20 from energy barrier 18.

Embodiments of substrates that may be used as base substrate 16 include, but are not limited to, full or partial bulk semiconductor substrates (e.g., full or partial silicon wafers, etc.) or full or partial silicon-on-insulator (SOI) type substrates (e.g., silicon-on-ceramic (SOC), silicon-on-glass (SOG), silicon-on-sapphire (SOS), etc.). In other embodiments, base substrate 16 may comprise a dielectric material, such as quartz, ceramic, sapphire, etc., without an overlying layer of semiconductor material.

Energy barrier 18, or an interface 19 between energy barrier 18 and the adjacent semiconductor film 20, inhibits the loss of charge carriers (e.g., holes), or, more simply, "carriers," from a transistor 12 on one side of energy barrier 18. In embodiments where energy barrier 18 is disposed against a carrier surface 17 of base substrate 16 that comprises a semiconductor material, either in bulk or as a layer formed upon a support structure, of base substrate 16, energy barrier 18 may prevent carriers from passing from transistor 12 into the semiconductor material of base substrate 16.

The properties of energy barrier 18, or of the interface 19 between energy barrier 18 and the overlying semiconductor film 20, may be attributed to physical properties of the material or materials from which energy barrier 18 is formed, including differences between those properties and corresponding properties of semiconductor film 20, the thickness of energy barrier 18, or a combination of the foregoing. In some embodiments, energy barrier 18 comprises a material with a bandgap energy (e.g., about 1.5 eV or greater, about 3 eV or greater, etc.) that is greater than the bandgap energy of silicon (i.e., 1.12 eV). Such a material may have an intrinsic concentration of carriers (e.g., holes) that is lower than the intrinsic concentration of the same type of carriers in the semiconductor material of base substrate 16.

An energy barrier 18 may have any thickness suitable for preventing the passage of carriers from a transistor on one side to the semiconductor material of the base substrate 16 on the opposite side. In some embodiments where energy barrier 18 comprises a silicon carbide, energy barrier 18 may have a thickness of about 50 nm (about 500 Å) to about 150 nm (about 1,500 Å). Of course, embodiments with energy barriers 18 that have other thicknesses are also within the scope of the present invention.

Silicon carbide (SiC) is a specific embodiment of a material from which energy barrier 18 may be formed. Silicon carbide has an intrinsic concentration of electron carriers that may be about $\frac{1}{10}^{16}$ (or $10^{-16}$) of the intrinsic concentration of electron carriers in single crystalline silicon. More specific embodiments of silicon carbide include the hexagonal (H) polytypes of SiC that are known as "4H—SiC" and "6H—SiC" and the cubic (C) polytype that is known as "3C—SiC." The following table compares various properties of 4H—SiC and 6H—SiC to the corresponding properties of silicon:

TABLE

|  | 4H—SiC | 6H—SiC | Silicon |
|---|---|---|---|
| Bandgap Energy (eV) | 3.26 | 3.03 | 1.112 |
| Maximum Drift Velocity (cm/sec @ E = 2 × 10$^5$ V/cm) | 2.0 × 10$^7$ | 2.0 × 10$^7$ | 1.0 × 10$^7$ |
| Thermal Conductivity (W/cm K @ 300 K) | 3.0 to 3.8 | 3.0 to 3.8 | 1.5 |
| Breakdown Electric Field (V/cm) | 2.2 × 10$^6$ | 2.4 × 10$^6$ | 2.5 × 10$^5$ |

In embodiments where energy barrier 18 comprises a silicon carbide (SiC), the silicon carbide may be expitaxially grown or otherwise disposed upon carrier surface 17 by known processes. Embodiments of such processes are described by Miura, H., et al., "Epitaxial Growth of SiC on Silicon on Insulator Substrates with Ultrathin Top Si Layer by Hot-Mesh Chemical Vapor Deposition," Japan J. Appl. Phys 47(1): 569 (2008); Stę szewski, J., et al. "Comparison of 4H—SiC and 6H—SiC MOSFET I-V characteristics simulated with Silvaco Atlas and Crosslight Apsys," J. Telecomm. & I.T., March 2007, page 93; Eickhoff, M., "Selective growth of high-quality 3C—SiC using a SiO$_2$ sacrificial-layer technique," Thin Solid Films 345(2): 197-99 (1999); Ernst, T., et al., "A new Si:C epitaxial channel nMOSFET architecture with improved drivability and short-channel characteristics," VLSI Symp. 2003:51-52 (2003); and Ernst, T., et al., "Fabrication of a Novel strained SiGe:C-channel planar 55 nm nMOSFET for High-Performance CMOS," VLSI Symp. 2002:92-93 (2002), the disclosures of each of which are hereby incorporated herein, in their entireties, by this reference. The intrinsic concentration of carriers in the silicon carbide correlates to the temperature at which the silicon carbide is deposited. In some embodiments, the intrinsic concentration of carriers in silicon carbide may be low; e.g., low (e.g., about $\frac{1}{10}^{16}$ (or $10^{16}$) the intrinsic concentration of carriers in single-crystalline silicon. silicon).

In other embodiments, energy barrier 18 may comprise a so-called "carbonated silicon," or Si:C, in which as much as about 1.4% of the molecules in the crystalline structure comprise carbon. Methods for forming a carbonated silicon energy barrier 18 are disclosed by Ernst, T., et al., "A new Si:C epitaxial channel nMOSFET architecture with improved drivability and short-channel characteristics," 2003 Symposium on VLSI Technology Digest of Technical Papers, pages 51-52, the entire disclosure of which is, by this reference, hereby incorporated herein.

In some embodiments, a semiconductor film 20 may be fabricated over energy barrier 18. Semiconductor film 20 may be fabricated by known processes, such as by the epitaxial growth of silicon upon energy barrier 18. Semiconductor film 20 may, in some embodiments, have a thickness of about 50 nm (about 500 Å) to about 150 nm (about 1,500 Å).

With semiconductor film 20 in place upon energy barrier 18, processes that are known in the art may be used to fabricate transistors 12 from and upon semiconductor film 20. Such processes include, without limitation, the fabrication of isolation structures, transistor channels, transistor gate dielectrics, transistor gates, spacers and caps (if any) for the transistor gates, and source and drain regions. The channels 26 of the resulting transistors 12 may include p-type material, in which the carriers are holes, and the source and drain 22, 24 may include n-type material. Various embodiments of the resulting structures are depicted in FIGS. 2 through 4.

Figure 2:
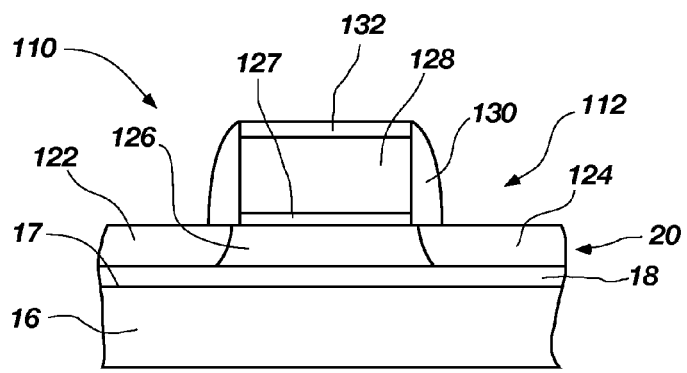
FIG. 2 illustrates an embodiment of a transistor according to the present invention with embedded active device regions.

FIG. 2 illustrates an embodiment of a semiconductor device structure 110 that includes a transistor 112 with source 122 and drain 124 regions and an intervening channel 126 formed in semiconductor film 20. A gate dielectric 127 is located over channel 126. A transistor gate 128 is carried by gate dielectric 127 with side wall spacers 130 adjacent to each side of transistor gate 128 and a cap 132 atop transistor gate 128. An energy barrier 18 is located beneath source 122 and drain 124 and above a semiconductor material at carrier surface 17 of base substrate 16.

Figure 3:
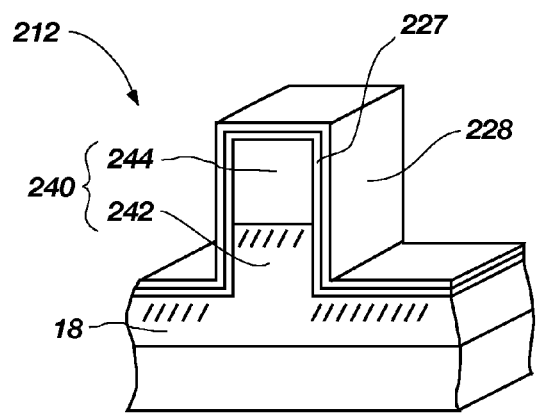
FIG. 3 depicts an embodiment of a fin field effect transistor (fin FET) according to the present invention.
Figure 4:
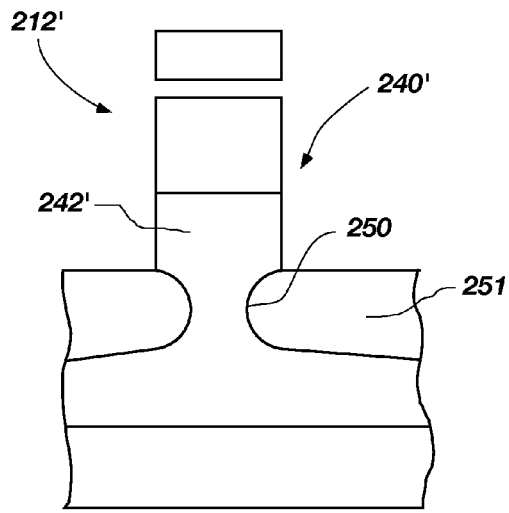
FIGS. 4 and 4A show other embodiments of "pseudo" silicon-on-insulator fin FETs of the present invention.

In FIG. 3, an embodiment of a so-called "fin field effect transistor" ("fin FET") 212 is depicted. Each fin 240 of fin FET 212 protrudes from energy barrier 18, with a protruding region of energy barrier 18 forming a base 242 of each fin 240 and the top 244 of each fin 240 comprising silicon (e.g., silicon defined from semiconductor film 20—FIG. 1). Known processes may be used to define one or more fins 240 from films that comprise silicon (to define top 244 of each fin 240 from semiconductor film 20) and an energy barrier material (to form base 242 of each fin 240 from energy barrier 18). In some embodiments, known mask and anisotropic etch processes may be used to define each fin 240.

A gate dielectric 227 is carried by the surfaces of each fin 240 and extends onto a major surface, depicted as the horizontally extending surface, of energy barrier 18. Gate dielectric 227, in turn, carries a transistor gate 228.

In some fin FET embodiments, such as the transistor 212' shown in FIG. 4, an undercut region 250 may be formed in and extend along both sides of base 242' of each fin 240'. Each undercut region 250 may be formed by known processes, such as by the use of an isotropic etchant, alone or in conjunction with known processes (e.g., use of selectively placed dopants in conjunction with the use of appropriate etchants, laser ablation techniques, etc.) for limiting the location and size of each undercut region 250.

Each undercut region 250 may, in some embodiments, be filled with a dielectric material (e.g., a silicon dioxide, etc.). In the embodiment depicted by FIG. 4, the dielectric material forms a film 251. Alternatively, in the embodiment depicted by FIG. 4A, dielectric elements 252 may be formed from the dielectric material. The results of both of the depicted embodiments are so-called "pseudo SOI" structures, in which a portion of each fin 240' overlies dielectric material.

Figure 4A:
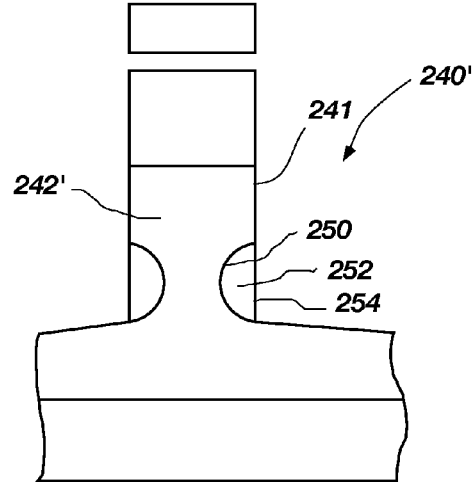

In the embodiment shown in FIG. 4A, each dielectric element 252 includes a surface 254 that is coplanar with, or substantially coplanar with, a side wall 241 of its corresponding fin 240'. Dielectric elements 252 may be formed by introducing (e.g., depositing, etc.) dielectric material onto an exposed surface of energy barrier 18 to form a dielectric film 251, such as that shown in FIG. 4. With the exception of dielectric material located within undercut regions 250, or beneath other regions of fins 240', all or substantially all, of the dielectric material that overlies energy barrier 18 may then be removed. In some embodiments, such removal may be effected by anisotropic etch processes. In embodiments where an etchant is employed that removes the dielectric material with high selectivity over the materials from which each fin 240' has been fabricated, each fin 240' may be used as a mask during the material removal process.

Once transistors 12, 112, 212, 212' have been fabricated, further processing, including, without limitation, the formation of interlayer dielectric films, interconnects, conductive lines, and back-end-of-line (BEOL) processing may be effected as known in the art.

With returned reference to FIG. 1, a semiconductor device structure 10 of the present invention may, in some embodiments, comprise a dynamic random access memory (DRAM) device, such as a DRAM device that includes 1TOC memory cells. The use of an energy barrier 18 in conjunction with one or more transistors 12 of such a structure may increase the amount of time that a memory cell associated with that transistor 12 will retain a charge (i.e., retain holes within the transistor channel).

Figure 5:
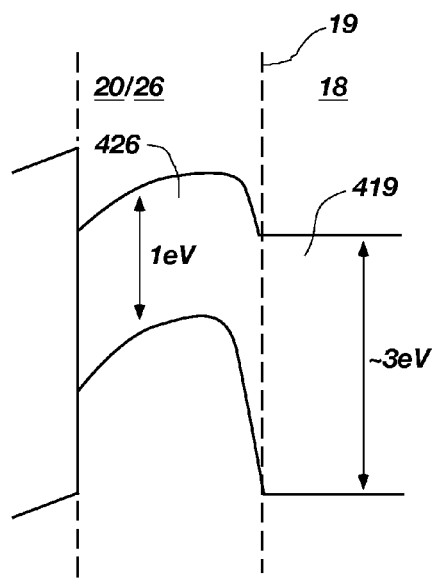
FIG. 5 is an energy band diagram of a transistor of the present invention in a "0" condition.
Figure 6:
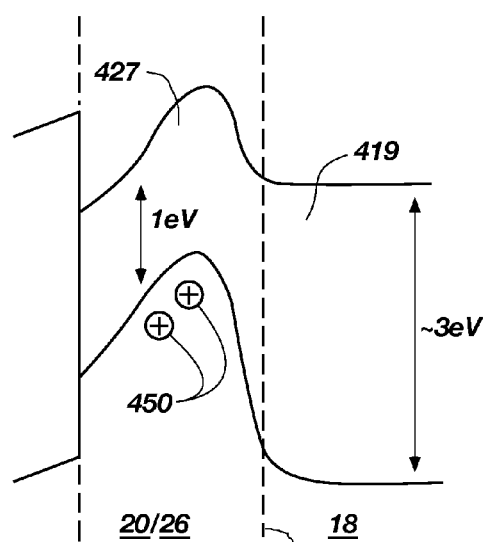
FIG. 6 is an energy band diagram of a transistor of the present invention in a "1" condition.

The ability of an energy barrier 18 according to embodiments of the present invention to prevent the loss of carriers from a transistor and, thus, to increase the retention in the floating body effect (FBE) of carriers within the transistor and the loss of charge stored by way of the transistor is depicted by the energy band diagrams of FIGS. 5 and 6.

In structures where silicon is adjacent to silicon carbide or carbonated silicon, an energy band offset occurs at the interface between these materials. FIGS. 5 and 6 both illustrate that the band gap 426, 427 of the semiconductor material (e.g., silicon—about 1 eV) of a transistor channel 26 is less than the band gap 419 of material of an energy barrier 18 adjacent to transistor channel 26.

In FIG. 5, the memory cell is in a "0" condition, with the difference in band gaps represented by a barrier line that corresponds to interface 19 (FIG. 1) between semiconductor film 20 and energy barrier 18.

FIG. 6 is an energy band diagram of the same memory cell in a "1" condition. It is apparent from a comparison between FIG. 5 and FIG. 6 that the band gaps 426, 427 and 419 of transistor channel 26 and energy barrier 18, respectively, are the same when the memory cell is in both states. The ability of interface 19 to retain carriers 450 within transistor channel 26 is also depicted in FIG. 6, with the heightened energy state being represented as a raised peak of portion of the energy band 427 that corresponds to transistor channel 26.

When an energy barrier is incorporated into a transistor, junction leakage, or the leakage of holes from a transistor channel into the base substrate, may be reduced or eliminated.

Although the foregoing description contains many specifics, these should not be construed as limiting the scope of the present invention, but merely as providing illustrations of some embodiments. Similarly, other embodiments that are within the scope of the invention may also be devised. Features from different embodiments may be employed in combination. The scope of the invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed is:

1. A fin field effect transistor, comprising:
    a fin including:
        a base comprising a protruding region of an energy barrier consisting essentially of carbonated silicon; and
        a top comprising semiconductor material on the base, side walls of the top substantially coplanar with side walls of the base;
    a gate dielectric coating at least a portion of the fin; and
    a gate electrode on the gate dielectric.

2. The fin field effect transistor of claim 1, wherein the top includes a p-type channel.

3. The fin field effect transistor of claim 1, wherein at least one side of the base of the fin has an undercut region therein.

4. The fin field effect transistor of claim 3, further comprising a dielectric material within the undercut region.

5. The fin field effect transistor of claim 4, wherein a surface of the dielectric material is substantially coplanar with a side wall of the fin.

6. The fin field effect transistor of claim 4, wherein the dielectric material is substantially limited to the undercut region of the fin.

7. The fin field effect transistor of claim 4, wherein the dielectric material comprises silicon dioxide.

8. The fin field effect transistor of claim 1, wherein multiple sides of the base of the fin have an undercut region therein.

9. The fin field effect transistor of claim 1, wherein the base of the fin is confined with lateral cross-sectional boundaries of the top of the fin.

10. The fin field effect transistor of claim 1, wherein the base of the fin and the top of the fin exhibit substantially the same lateral cross-sectional area.

11. The fin field effect transistor of claim 1, wherein the gate dielectric extends continuously over a top surface of the fin, opposing side surfaces of the fin, and a surface of the energy barrier adjacent the fin.

12. The fin field effect transistor of claim 1, wherein the gate electrode extends continuously over a top surface of the fin, opposing side surfaces of the fin, and a surface of the energy barrier adjacent the fin.

13. The fin field effect transistor of claim 1, wherein the energy barrier consists essentially of epitaxial carbonated silicon.

14. The fin field effect transistor of claim 1, wherein the top of the fin comprises single crystalline silicon.

15. The fin field effect transistor of claim 1, wherein the top of the fin comprises epitaxial silicon.

16. The fin field effect transistor of claim 1, wherein the top of the fin comprises p-type silicon.

17. The fin field effect transistor of claim 1, wherein the carbonated silicon comprises up to about 1.4% carbon atoms.

18. The fin field effect transistor of claim 1, wherein the base of the fin consists essentially of the carbonated silicon, and wherein the top of the fin comprises epitaxial silicon.

* * * * *